(12) United States Patent
Lai et al.

(10) Patent No.: US 12,100,682 B2
(45) Date of Patent: Sep. 24, 2024

(54) PACKAGE STRUCTURE WITH CONDUCTIVE PATTERNS IN A REDISTRIBUTION LAYER

(71) Applicant: Taiwan Semiconductor Manufacturing Co., Ltd., Hsinchu (TW)

(72) Inventors: Yu-Chia Lai, Miaoli County (TW); Chih-Horng Chang, Taipei (TW); Hao-Yi Tsai, Hsinchu (TW); Chih-Hsuan Tai, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 67 days.

(21) Appl. No.: 16/035,696

(22) Filed: Jul. 15, 2018

(65) Prior Publication Data

US 2020/0020657 A1    Jan. 16, 2020

(51) Int. Cl.
*H01L 23/00* (2006.01)
*H01L 21/56* (2006.01)
(Continued)

(52) U.S. Cl.
CPC ............ *H01L 24/20* (2013.01); *H01L 21/565* (2013.01); *H01L 21/568* (2013.01);
(Continued)

(58) Field of Classification Search
CPC . H01L 2224/0401; H01L 24/13; H01L 24/05; H01L 2224/05572; H01L 24/17; H01L 24/20; H01L 21/565; H01L 21/568; H01L 21/6835; H01L 23/3128; H01L 24/19; H01L 24/25; H01L 25/105; H01L 2221/68345; H01L 2221/68359; H01L 2224/211; H01L 2224/221; H01L 2224/24145; H01L 2224/2518; H01L 2225/1035; H01L 2225/1041; H01L 2225/1058; H01L 2924/19102; H01L 2924/2064; H01L 2224/48091; H01L 2224/73265; H01L 2224/73267; H01L 2224/8385; H01L 2224/92244;
(Continued)

(56) References Cited

U.S. PATENT DOCUMENTS 6,265,783 B1 *   7/2001   Juso ..................... H01L 23/3128
                                                            257/738
8,198,738 B1 *   6/2012   Hwang .................. H01L 24/05
                                                            257/784
(Continued)

*Primary Examiner* — David Chen
(74) *Attorney, Agent, or Firm* — JCIPRNET

(57) ABSTRACT

A package structure includes an insulating encapsulation, a semiconductor die, and a redistribution circuit structure. The semiconductor die is encapsulated in the insulating encapsulation. The redistribution circuit structure includes conductive patterns, wherein the conductive patterns each comprise a first portion, at least one second portion, and at least one connecting portion. A first edge of the at least one connecting portion is connected to the first portion, and a second edge of the at least one connecting portion is connected to the at least one second portion, wherein the first edge is opposite to the second edge, and a length of the first edge is greater than a length of the second edge.

20 Claims, 13 Drawing Sheets

(51) Int. Cl.
*H01L 21/683* (2006.01)
*H01L 23/31* (2006.01)
*H01L 25/10* (2006.01)

(52) U.S. Cl.
CPC ...... *H01L 21/6835* (2013.01); *H01L 23/3128* (2013.01); *H01L 24/05* (2013.01); *H01L 24/19* (2013.01); *H01L 24/25* (2013.01); *H01L 25/105* (2013.01); *H01L 2221/68345* (2013.01); *H01L 2221/68359* (2013.01); *H01L 2224/211* (2013.01); *H01L 2224/221* (2013.01); *H01L 2224/24145* (2013.01); *H01L 2224/2518* (2013.01); *H01L 2225/1035* (2013.01); *H01L 2225/1041* (2013.01); *H01L 2225/1058* (2013.01); *H01L 2924/19102* (2013.01); *H01L 2924/2064* (2013.01)

(58) Field of Classification Search
CPC . H01L 2924/15311; H01L 2924/19106; H01L 2224/32225; H01L 2924/00014
USPC .............. 257/737, 738, 786, 21.508, 23.021, 257/23.069; 438/612, 613
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,691,708 B1* | 6/2017 | Huang | H01L 23/5389 |
| 2011/0254154 A1* | 10/2011 | Topacio | H01L 23/562 |
| | | | 257/737 |
| 2013/0175075 A1* | 7/2013 | Kivikero | H01L 24/20 |
| | | | 174/260 |
| 2013/0270682 A1* | 10/2013 | Hu | H01L 25/50 |
| | | | 257/E21.705 |
| 2014/0061900 A1* | 3/2014 | Park | H01L 23/3114 |
| | | | 257/737 |
| 2014/0252610 A1* | 9/2014 | Chen | H01L 24/05 |
| | | | 257/738 |
| 2015/0333022 A1* | 11/2015 | Albers | H01L 24/05 |
| | | | 257/737 |
| 2016/0049389 A1* | 2/2016 | Chen | H01L 21/565 |
| | | | 438/107 |
| 2017/0077143 A1* | 3/2017 | Lee | G02F 1/13458 |
| 2017/0092581 A1* | 3/2017 | Chiu | H01L 21/76877 |
| 2017/0092604 A1* | 3/2017 | Hsieh | H01L 24/11 |
| 2018/0374769 A1* | 12/2018 | Fehler | H01L 23/3114 |

\* cited by examiner

PACKAGE STRUCTURE WITH CONDUCTIVE PATTERNS IN A REDISTRIBUTION LAYER

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
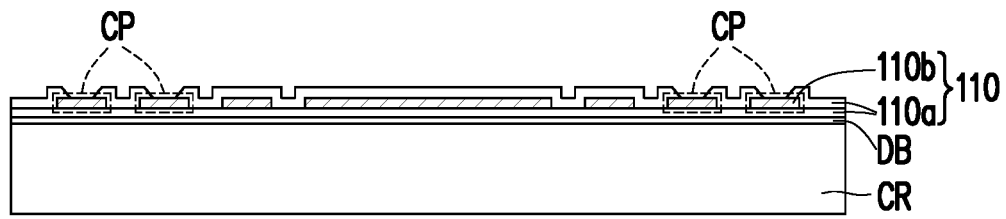
FIG. 1 to FIG. 9 are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic cross sectional views of various stages in a manufacturing method of a package structure in accordance with some embodiments of the disclosure. FIG. 10 is a top view illustrating positioning locations of conductive patterns relative to diagonal lines of a package structure in accordance with some embodiments of the disclosure. FIG. 11A to FIG. 11D are top views illustrating various predetermined patterns of a conductive pattern included in a package structure in accordance with some embodiments of the disclosure. FIG. 12A to FIG. 12D are top views illustrating various predetermined patterns of a conductive pattern included in a package structure in accordance with some embodiments of the disclosure. In exemplary embodiments, the manufacturing method is part of a packaging process. In FIG. 1 to FIG. 9, one (semiconductor) chip or die is shown to represent plural (semiconductor) chips or dies of the wafer, and a first package 10 and a second package 20 are shown to represent a package structure PS obtained following the manufacturing method, for example. In other embodiments, two (semiconductor) chips or dies are shown to represent plural (semiconductor) chips or dies of the wafer, and one or more first and second packages 10, 20 are shown to represent plural (semiconductor) package structures PS obtained following the (semiconductor) manufacturing method, the disclosure is not limited thereto.

Referring to FIG. 1, in some embodiments, a carrier CR with a debond layer DB coated thereon is provided. In one embodiment, the carrier CR may be a glass carrier or any suitable carrier for carrying a semiconductor wafer or a reconstituted wafer for the manufacturing method of the semiconductor package.

In some embodiments, the debond layer DB is disposed on the carrier CR, and the material of the debond layer DB may be any material suitable for bonding and debonding the carrier CR from the above layer(s) or any wafer(s) disposed thereon. In some embodiments, the debond layer DB may include a release layer (such as a light-to-heat conversion ("LTHC") layer) or an adhesive layer (such as an ultra-violet curable adhesive or a heat curable adhesive layer).

Continued on FIG. 1, in some embodiments, a redistribution circuit structure 110 is formed over the carrier CR. For example, in FIG. 1, the redistribution circuit structure 110 is formed on the debond layer DB, and the formation of the redistribution circuit structure 110 includes sequentially forming one or more dielectric layers 110a and one or more metallization layers 110b in alternation. In some embodiments, the redistribution circuit structure 110 includes two dielectric layers 110a and one metallization layer 110b as shown in FIG. 1, where the metallization layer 110b is sandwiched between the dielectric layers 110a, and portions of a top surface of the metallization layer 110b are respectively exposed by the openings of a topmost layer of the dielectric layers 110a. However, the disclosure is not limited thereto. The numbers of the metallization layers and the dielectric layers included in the redistribution circuit structure 110 is not limited thereto, and may be designated and selected based on the demand. For example, the numbers of the metallization layers and the dielectric layers may be one or more than one.

In certain embodiments, the material of the dielectric layers 110a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 110a formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 110b may be made of conductive materials formed by electroplating or deposition, such as aluminum, titanium, copper, nickel, tungsten, and/or alloys thereof, which may be patterned using a photolithography and etching process. In some embodiments, the metallization layer 110b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As shown in FIG. 1, in some embodiments, one or more conductive patterns CP are formed in the metallization layer 110b of the redistribution circuit structure 110. For example, as shown on FIG. 1, the metallization layer 110b is patterned to have the conductive patterns CP, where the conductive patterns CP may provide electrical path between later-formed elements (such as semiconductor dies, conductive pillars/vias conductive elements/connectors, external electric devices/elements (e.g. a power supply, a grounding device, etc), or the like). In some embodiments, the conductive patterns CP are patterned to be in a form of a predetermined target pattern depicted in FIG. 11A to FIG. 11D and/or FIG. 12A and FIG. 12D. In some embodiments, the conductive patterns CP have the same pattern, however the disclosure is not limited thereto. In one embodiment, the conductive patterns CP have different patterns.

Referring to FIG. 1, FIG. 11A to FIG. 11D and FIG. 12A and FIG. 12D, certain structural features including the metallization layer 110b and the conductive patterns CP are stressed for illustration purposes, and only one conductive pattern CP is shown in FIG. 11A to FIG. 11D and FIG. 12A and FIG. 12D for easy illustration and is not intended to limit the disclosure.

Figure 11A:
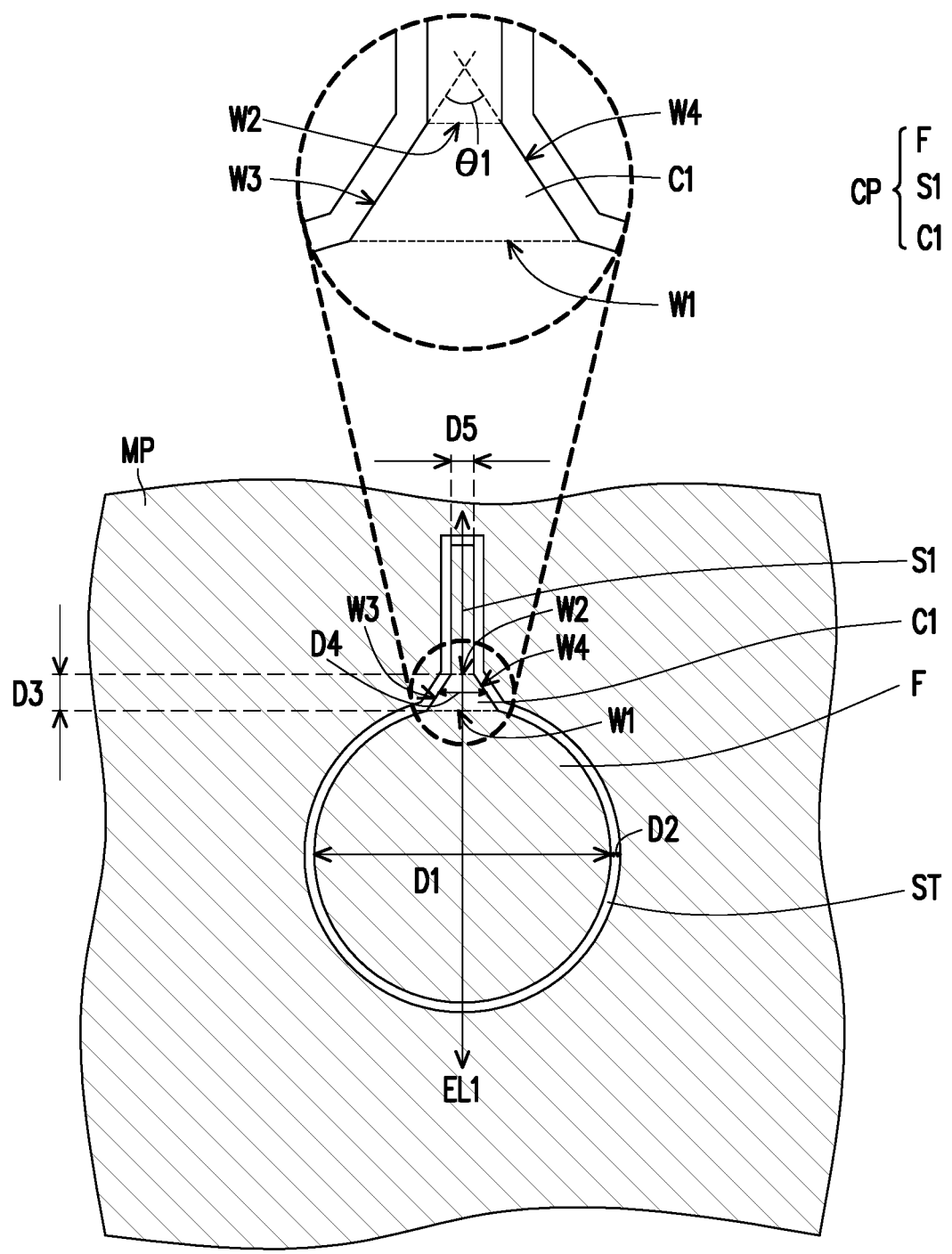
FIG. 11A to FIG. 11D are top views illustrating various predetermined patterns of a conductive pattern included in a package structure in accordance with some embodiments of the disclosure.

In some embodiments, as shown in FIG. 11A, the metallization layer 110b includes a main portion MP and the conductive pattern CP, where the conductive pattern CP is separated from the main portion MP by a slit (opening) ST. In the disclosure, the main portion MP of the metallization layer 110b serves as the ground plate for the package structure PS, and the conductive pattern CP of in the metallization layer 110b serves as signal traces/pads for receiving power supply or transmitting electric signals for the package structure PS, where the conductive pattern CP is electrically isolated from the main portion MP through the slit ST. However, the disclosure is not specifically limited thereto. In one embodiment, the conductive pattern CP of in the metallization layer 110b may serve as signal traces/pads for receiving power supply, being electrically grounded or floating, or transmitting electric signals for the package structure PS. For example, the formation of the conductive pattern CP may be performed by photolithography and etching processes. In some embodiments, a width D2 of the slit ST is constant, however the disclosure is not limited thereto. In one embodiment, the width D2 of the slit ST is approximately from 40 µm to 50 µm. As shown in FIG. 11A, the slit ST is conformally located along the contour of the conductive pattern CP, in some embodiments.

In some embodiments, the conductive pattern CP includes a first portion F, a second portion S1, and a connecting portion C1 connecting the first portion F and the second portion S1. As shown in FIG. 11A, the connecting portion C1 is located outside and physically connected to the first portion F and the second portion S1, where the connecting portion C1 is sandwiched between the first portion F and the second portion S1 along an extending line EX1, and the extending line EL1 of the conductive pattern CP pass through a center of the first portion F, a center of the connecting portion C1, and a center of the second portion S1.

In some embodiments, the first portion F has a conductive pad, where the conductive pad is serving as a contact region connected to a later-formed element (e.g. a conductive pillar/via, a conductive element/connector (such as a conductive ball), or the like) for electrically connecting the semiconductor die sequentially formed. In one embodiment, from the top view of FIG. 11A, the first portion F has a substantially a circular shape, however the disclosure is not limited thereto. In an alternative embodiment, the first portion F may substantially have an elliptical shape, a rectangular shape, an octagonal shape, or a polygonal shape, or the like, from the top view. In some embodiments, a size D1 of the first portion F is approximately from 200 µm to 300 µm.

In some embodiments, the connecting portion C1 has a first edge W1, a second edge W2, a third edge W3, and a fourth edge W4, where the first edge W1 is opposite to the second edge W2, and the third edge W3 is opposite to the fourth edge W4. For example, as shown in FIG. 11A, in the connecting portion C1, a first end of the first edge W1 is connected to the third edge W3, a second end of the first edge W1 is connected to the fourth edge W4, a first end of the second edge W2 is connected to the third edge W3, and a second end of the second edge W2 is connected to the fourth edge W4, where the first end of the first edge W1 and the first end of the second edge W2 are located at a first side of the extending line EL1, and the second end of the first edge W1 and the second end of the second edge W2 are located at a second side of the extending line EL1. In other words, the third edge W3 and the fourth edge W4 individually connects to one end of the first edge W1 and one end of the second edge W2. As shown in FIG. 11A, in some embodiments, a length of the first edge W1 is greater than a length of the second edge, and the third edge W3 is non-parallel to the fourth edge W4, where an included angle θ1 between extending lines of the third edge W3 and the fourth edge W4 is approximately from 50 degrees to 70 degrees. In some embodiments, a distance D3 between the first edge W1 and the second edge W2 is approximately from 50 μm to 70 μm. In some embodiments, the third edge W3 and the fourth edge W4 is separated by a distance D4. As shown in FIG. 11A, the second edge W2 is distant from the first portion F and is not in physical contact with the first portion F. In some embodiments, the connecting portion C1 is referred to as a protrusion extending from an edge of the first portion F toward an edge of the second portion S1, where a width (e.g. the distance D4) of the protrusion is gradually decreased from the first portion F toward the second portion S1.

In some embodiments, the second portion S1 has a conductive line serving as a contact line, where an end portion of the conductive line is serving as a contact region connected to a later-formed element (e.g. a conductive pillar/via, a conductive element/connector (such as a conductive ball), or the like) for electrically connecting the semiconductor die sequentially formed. As shown in FIG. 11A, the second portion S1 is physically connected to the connecting portion C1 through the second edge W2; that is, the first edge W1 is distant from the second portion S1 and is not in physical contact with the second portion S1. In one embodiment, from the top view of FIG. 11A, the second portion S1 has a substantially a linear strip shape, however the disclosure is not limited thereto. In an alternative embodiment, the second portion S1 may substantially have a curved strip shape which has one or more than one included angle, from the top view. In some embodiments, a size D5 of the second portion S1 is approximately from 0.01*D1 to 0.05*D1. In FIG. 11A, for example, the first portion F of the conductive pattern CP is electrically connected to the second portion S1 through the connecting portion C1 while the conductive pattern CP is electrically isolated from the main portion MP of the metallization layer 110b of the redistribution circuit structure 110. Due to the conductive pattern CP, the conductor material of the later-formed element (e.g. a conductive connector/element, a conductive pillar/via or the like) is isolated and prevented from flowing to the main portion MP of the metallization layer 110b, and thus the reliability of the package structure PS can be ensured.

The disclosure is not limited thereto; and in an alternative embodiment, the conductive pattern CP may have more than one connecting portion and more than one second portion. In some embodiments, the connecting portions are connected to the first portion F and are spacing at an equal distance apart from each other. That is, for example, the connecting portions are equidistantly arranged at the perimeter (edge) of the first portion F.

Figure 11B:
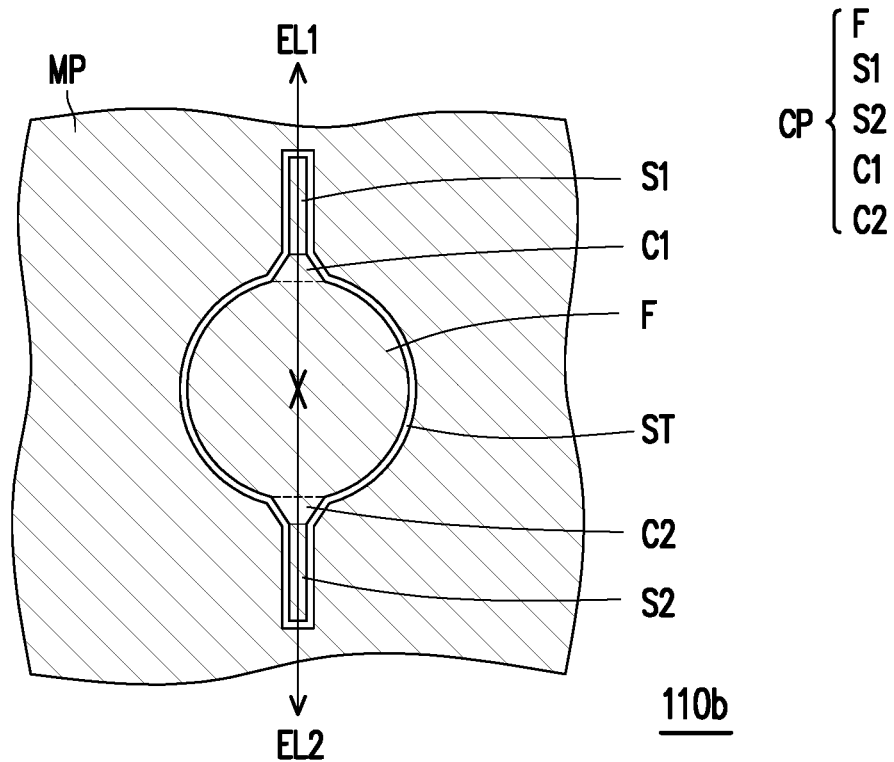

As shown in FIG. 11B, in some embodiments, the conductive pattern CP has the first portion F, two second portions S1 and S2 and the corresponding connecting portions C1 and C2, where the second portion S1 is connected to the first portion F through the connecting portion C1, and the second portion S2 is connected to the first portion F through the connecting portion C2, as such the first portion F are electrically connected to the second portions S1 and S2 through the corresponding connecting portions C1 and C2, respectively. Similarly, to FIG. 11A, in FIG. 11B, the connecting portion C1 is sandwiched between the first portion F and the second portion S1 along the extending line EX1 passing through the centers of the first portion F, the connecting portion C1 and the second portion S1. In addition, the connecting portion C2 is sandwiched between the first portion F and the second portion S2 along an extending line EX2, and the extending line EL2 passes through a center of the first portion F, a center of the connecting portion C2, and a center of the second portion S2.

Figure 11C:
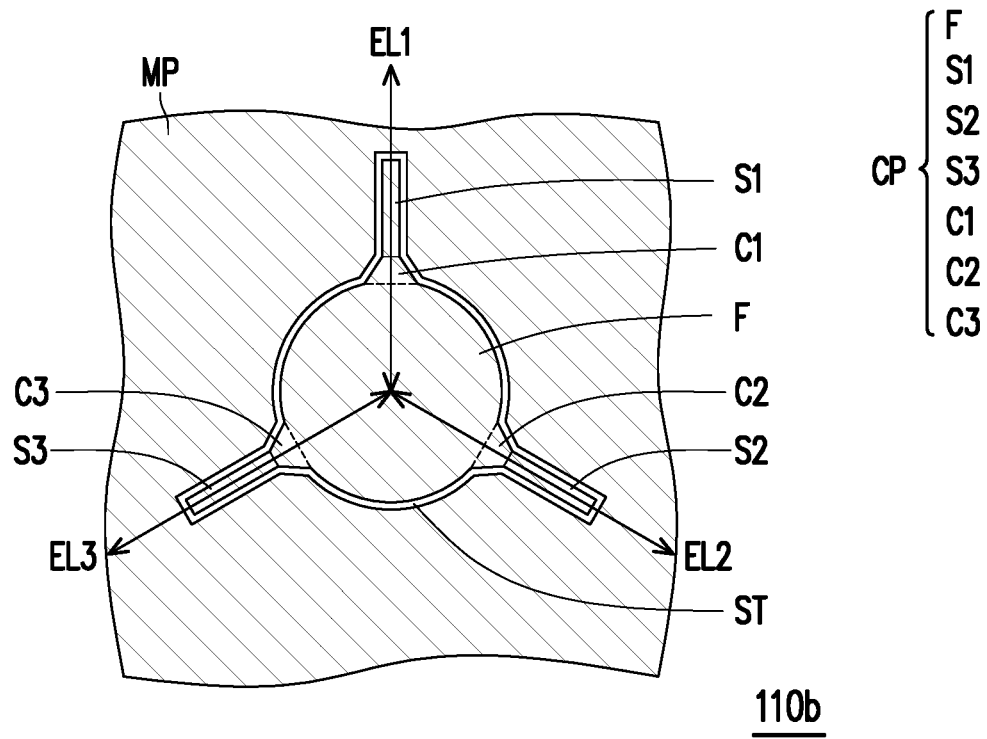

As shown in FIG. 11C, in some embodiments, the conductive pattern CP has the first portion F, three second portions S1~S3 and the corresponding connecting portions C1~C3, where the second portion S1 is connected to the first portion F through the connecting portion C1, the second portion S2 is connected to the first portion F through the connecting portion C2, and the second portion S3 is connected to the first portion F through the connecting portion C3, as such the first portion F are electrically connected to the second portions S1~S3 through the corresponding connecting portions C1~C3, respectively. Similarly, to FIG. 11A, in FIG. 11C, the connecting portion C1 is sandwiched between the first portion F and the second portion S1 along the extending line EX1 passing through the centers of the first portion F, the connecting portion C1 and the second portion S1. In addition, the connecting portion C2 is sandwiched between the first portion F and the second portion S2 along an extending line EX2 passing through a center of the first portion F, a center of the connecting portion C2, and a center of the second portion S2, and the connecting portion C3 is sandwiched between the first portion F and the second portion S3 along an extending line EX3 passing through a center of the first portion F, a center of the connecting portion C3, and a center of the second portion S3.

Figure 11D:
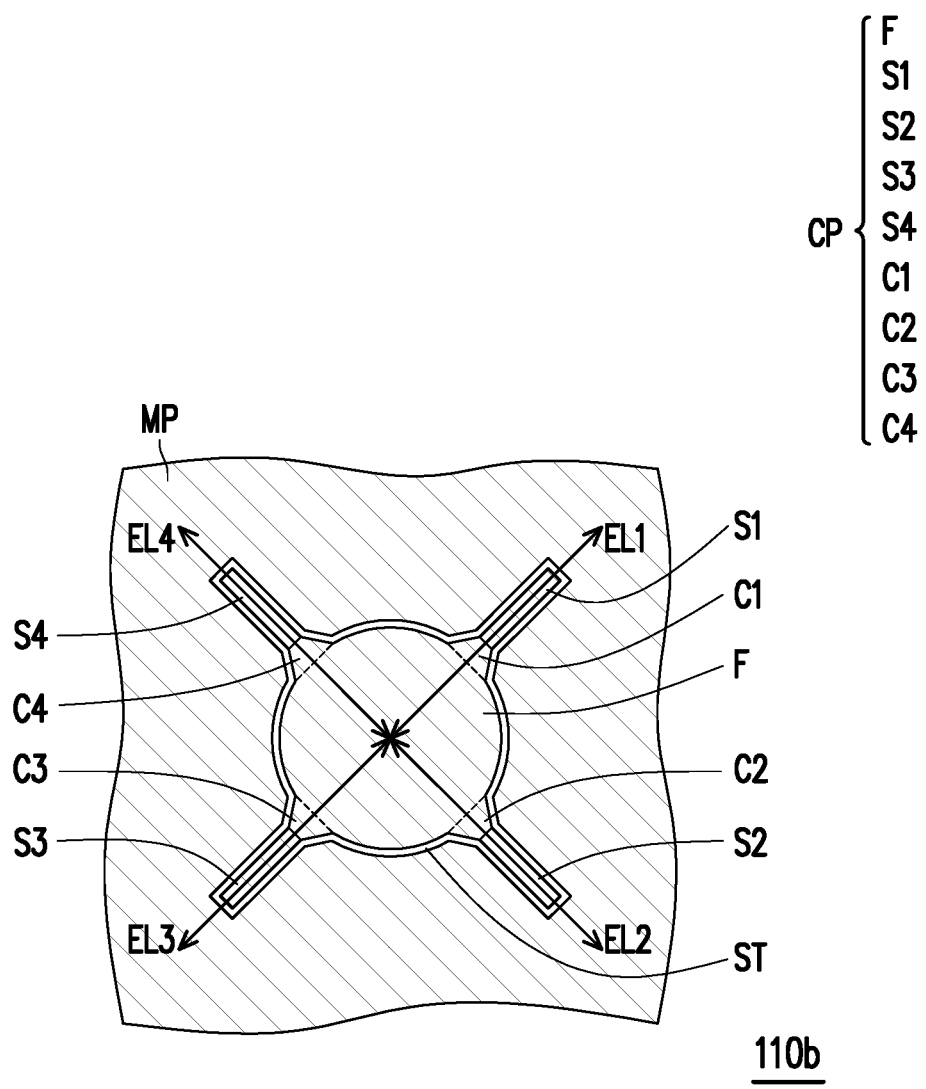
Figure 12A:
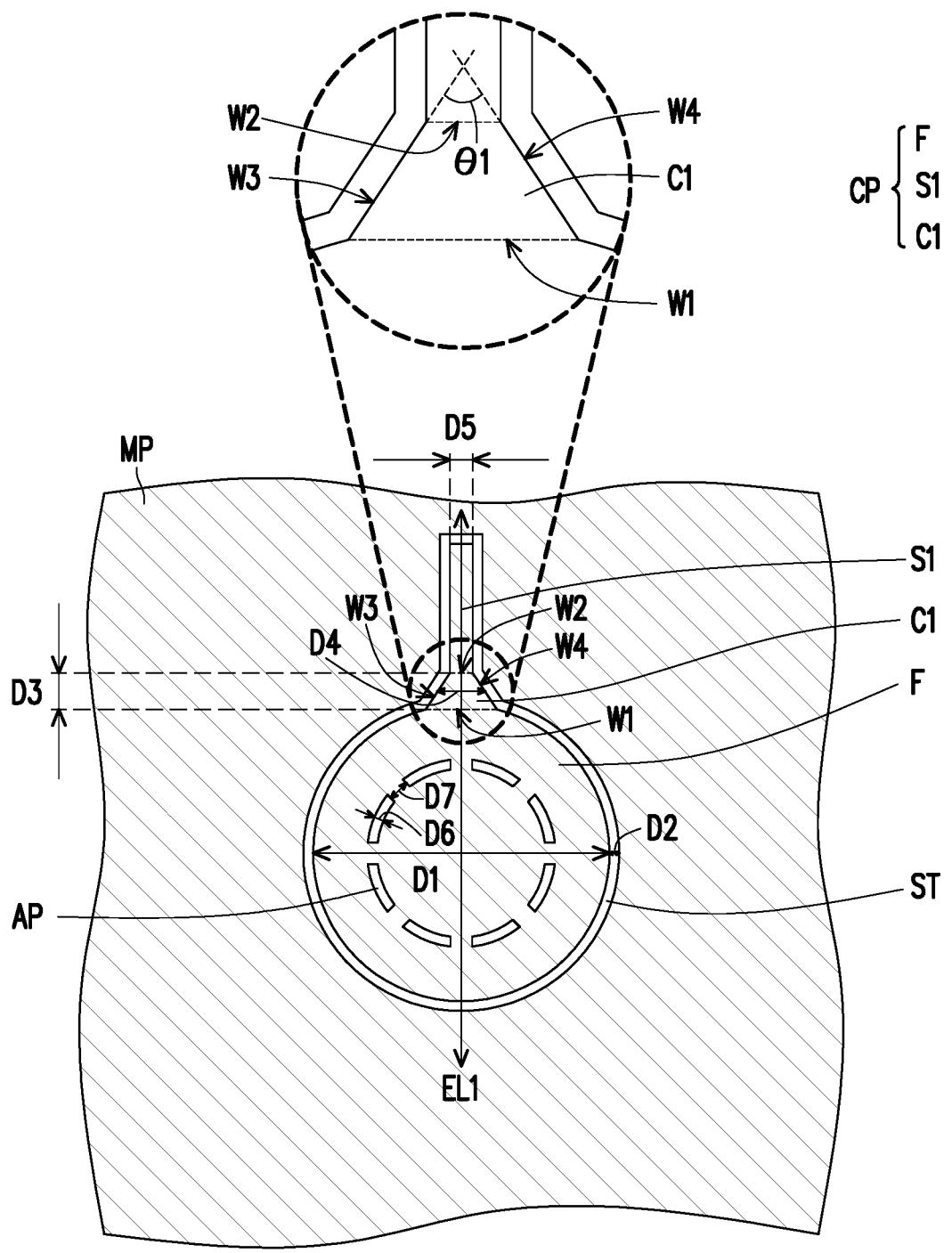
FIG. 12A to FIG. 12D are top views illustrating various predetermined patterns of a conductive pattern included in a package structure in accordance with some embodiments of the disclosure.
Figure 12B:
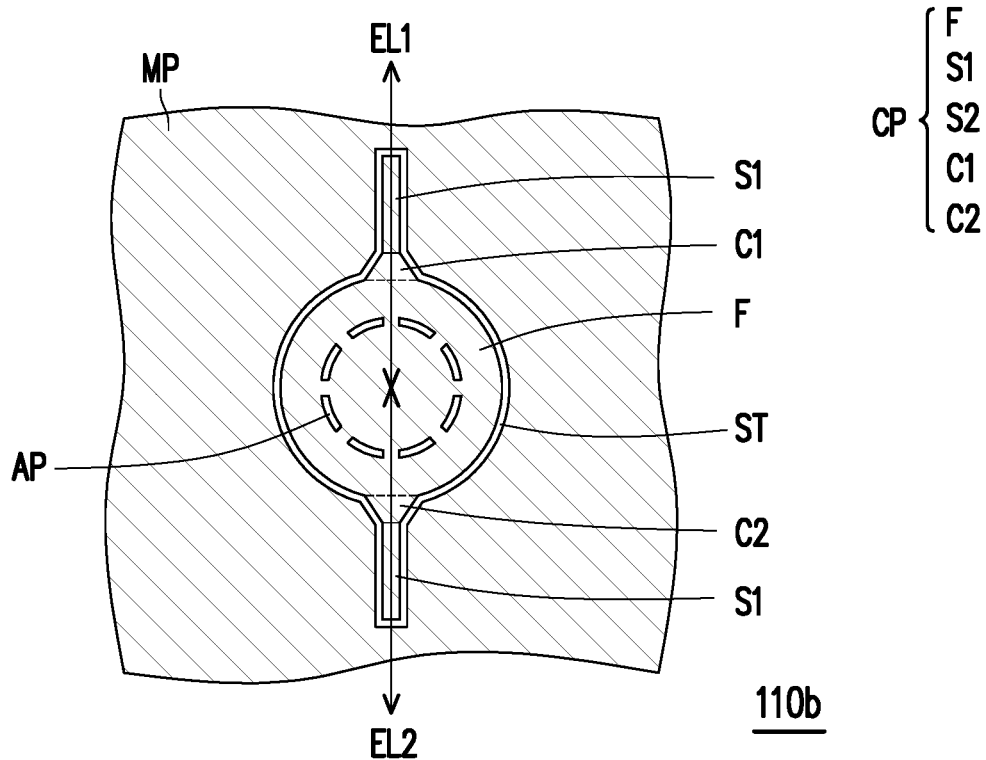
Figure 12C:
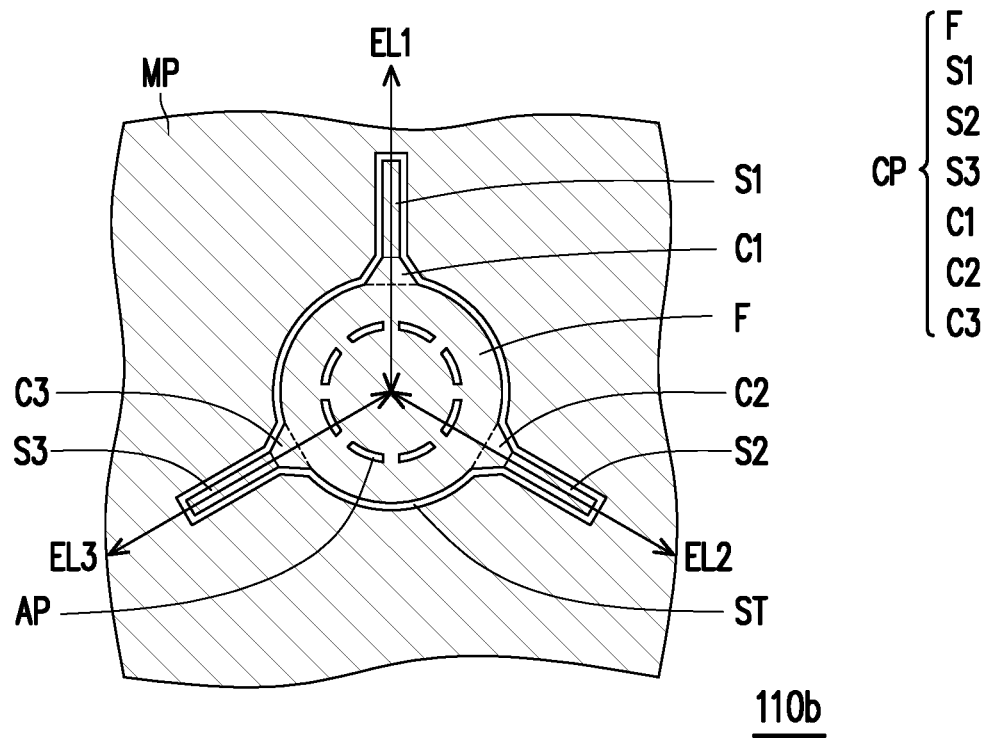
Figure 12D:
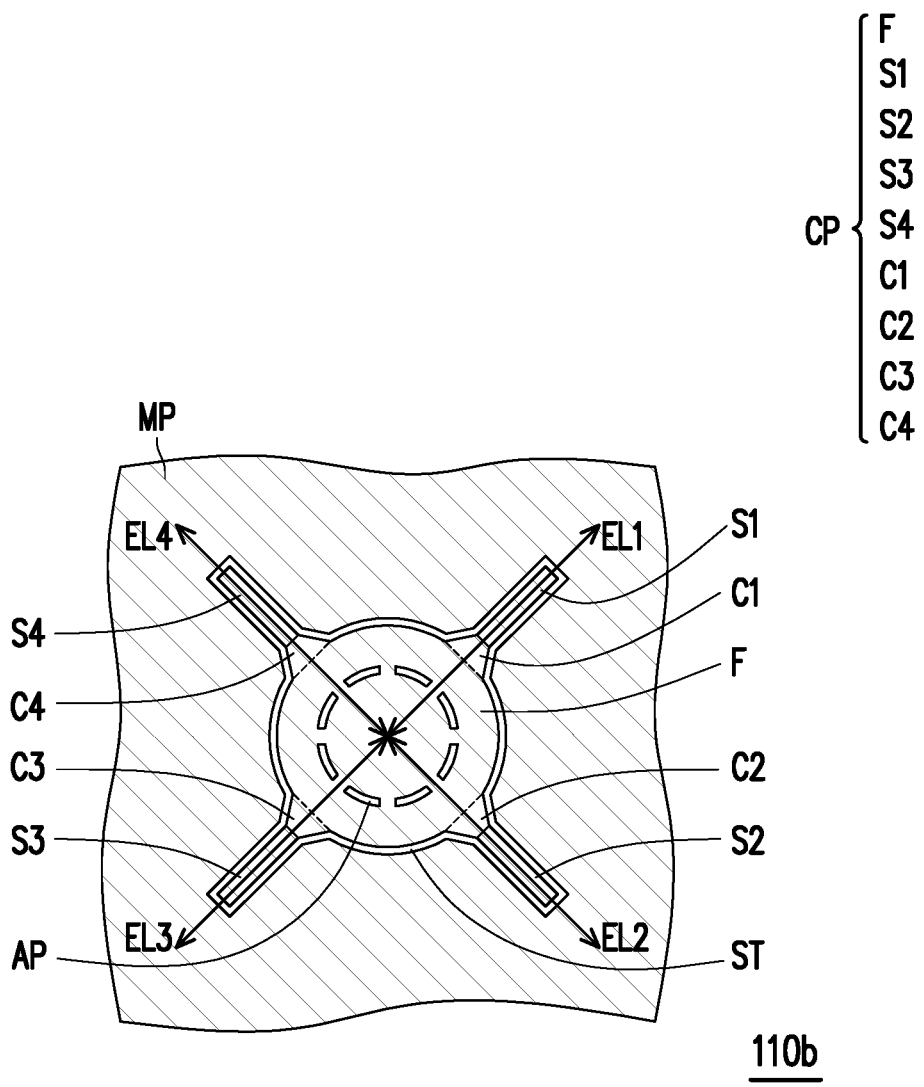

As shown in FIG. 11D, in some embodiments, the conductive pattern CP has the first portion F, three second portions S1~S4 and the corresponding connecting portions C1~C4, where the second portion S1 is connected to the first portion F through the connecting portion C1, the second portion S2 is connected to the first portion F through the connecting portion C2, the second portion S3 is connected to the first portion F through the connecting portion C3, and the second portion S4 is connected to the first portion F through the connecting portion C4, as such the first portion F are electrically connected to the second portions S1~S4 through the corresponding connecting portions C1~C4, respectively. Similarly, to FIG. 11A, in FIG. 11D, the connecting portion C1 is sandwiched between the first portion F and the second portion S1 along the extending line EX1 passing through the centers of the first portion F, the connecting portion C1 and the second portion S1. In addition, the connecting portion C2 is sandwiched between the first portion F and the second portion S2 along an extending line EX2 passing through a center of the first portion F, a center of the connecting portion C2, and a center of the second portion S2, the connecting portion C3 is sandwiched between the first portion F and the second portion S3 along an extending line EX3 passing through a center of the first portion F, a center of the connecting portion C3, and a center of the second portion S3, and the connecting portion C4 is sandwiched between the first portion F and the second portion S4 along an extending line EX4 passing through a center of the first portion F, a center of the connecting portion C4, and a center of the second portion S4.

However, the disclosure is not limited thereto. The numbers of the second portions and connecting portions are corresponded to each other and may be selected based on the design layout and the demand.

In a further alternative embodiment, a plurality of arc-shape openings AP are formed in the first portion F as shown in FIG. 12A to FIG. 12D, where the arc-shape openings AP are spaced away from one another and arranged in a concentric manner. In some embodiments, a width D6 of the arc-shape openings AP is approximately from about 40 μm to about 50 μm. In some embodiments, the arc-shape openings AP are equidistantly spaced apart from one another. In some embodiments, a distance D7 between two adjacent arc-shape openings AP of the arc-shape openings AP is approximately from about 20 μm to about 40 μm. As shown in FIG. 12A to FIG. 12D, the arc-shape openings AP together surround a region for disposing a later-formed element (e.g. a conductive connector/element, a conductive pillar/via, a conductive ball or the like). There are eight arc-shape openings AP presented in FIG. 12A to FIG. 12D for illustrative purposes, however it should be noted that the number of the arc-shape openings AP may be less than eight or more than eight; the disclosure is not limited thereto. Due to the arc-shape openings AP, the conductor material of the later-formed element (e.g. a conductive connector/element, a conductive pillar/via or the like) may further be isolated and prevented from flowing to the main portion MP of the metallization layer 110b, and thus the reliability of the package structure PS can be ensured.

Figure 2:
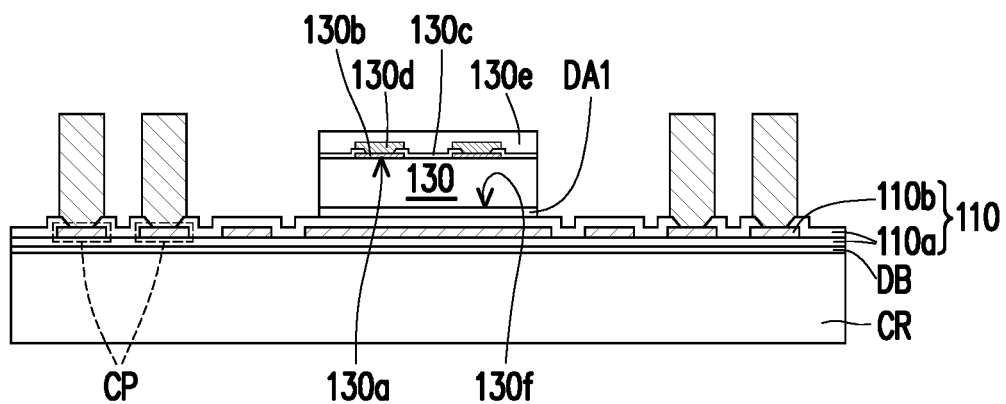

Referring to FIG. 2, in some embodiments, conductive pillars 120 are formed on the redistribution circuit structure 110. In some embodiments, the conductive pillars 120 may be through vias, such as through integrated fan-out (InFO) vias. For simplification, only four conductive pillars 120 are presented in FIG. 2 for illustrative purposes, however it should be noted that the number of the conductive pillars 120 may be less than four or more than four; the disclosure is not limited thereto. The number of the conductive pillars 120 to be formed can be selected based on the demand.

In some embodiments, the conductive pillars 120 are formed by photolithography, plating, photoresist stripping processes or any other suitable method. In one embodiment, the conductive pillars 120 may be formed by forming a mask pattern (not shown) covering the redistribution circuit structure 110 with openings exposing the top surface of the metallization layer 110b exposed by the topmost layer of the dielectric layers 110a, forming a metallic material filling the openings to form the conductive pillars 120 by electroplating or deposition and then removing the mask pattern. In one embodiment, the material of the conductive pillars 120 may include a metal material such as copper or copper alloys, or the like. However, the disclosure is not limited thereto.

Continued on FIG. 2, in some embodiments, at least one semiconductor die 130 with a connecting film DA1 disposed thereon is provided, where the semiconductor die 130 has an active surface 130a and a backside surface 130f opposite to the active surface 130a. As shown in FIG. 2, the semiconductor die 130 is disposed on the redistribution circuit structure 110 and over the carrier CR through the connecting film DA1. In some embodiments, the connecting film DA1 is located between the semiconductor die 130 and the redistribution circuit structure 110, and the connecting film DA1 is physically contacts the backside surface 130f of the semiconductor die 130 and the redistribution circuit structure 110 (e.g. the topmost layer of the dielectric layers 110a of the redistribution circuit structure 110). In some embodiments, due to the connecting film DA1 provided between the semiconductor die 130 and the redistribution circuit structure 110, the semiconductor die 130 and the redistribution circuit structure 110 are stably adhered to each other. In some embodiments, the connecting film DA1 may be, for example, a semiconductor die attach film, a layer made of adhesives or epoxy resin, or the like. In some embodiments, the redistribution circuit structure 110 is referred to as a back-side redistribution layer of the semiconductor die 130 for providing routing function.

As shown in FIG. 2, for example, the conductive pillars 120 are located aside of a location of the semiconductor die 130, and are mechanically and electrically connected to the metallization layer 110b of the redistribution circuit structure 110. In certain embodiments, the conductive pillars 120 are connected to the conductive patterns CP, respectively; which (the conductive patterns CP of) the redistribution circuit structure 110 is electrically connected to the conductive pillars 120. In FIG. 2, a height of the conductive pillars 120 is greater than a height of the at least one semiconductor die 130, for example; however, the disclosure is not limited thereto. In an alternative embodiment, the height of the conductive pillars 120 may be less than or substantially equal to the height of the at least one semiconductor die 130. In one embodiment, the conductive pillars 120 may be formed prior to the formation of the semiconductor die 130. In an alternative embodiment, the conductive pillars 120 may be formed after the formation of the semiconductor die 130. The disclosure is not limited to the disclosure.

In some embodiments, as shown in FIG. 2, the semiconductor die 130 includes the active surface 130a, a plurality of pads 130b distributed on the active surface 130a, a passivation layer 130c covering the active surface 130a and a portion of the pad 130b, a plurality of conductive vias 130d connected to the portion of the pads 130b, a protection layer 130e covering the pads 130b and the conductive vias 130d, and the backside surface 130f opposite to the active surface 130a. The pads 130b are partially exposed by the passivation layer 130c, the conductive vias 130d are disposed on and electrically connected to the pads 130b, and the protection layer 130e covers the passivation layer 130c and the conductive vias 130d.

In some embodiments, the pads 130b may be aluminum pads or other suitable metal pads. In some embodiments, the conductive vias 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the conductive vias 130d and the protection layer 130e may be omitted; that is, the semiconductor die 130 may include the pads 130b distributed on the active surface 130a, the passivation layer 130c covering the active surface 130a and the pad 130b, the backside surface 130f opposite to the active surface 130a. The disclosure is not limited thereto.

As shown in FIG. 2, only one semiconductor die 130 is presented for illustrative purposes, however it should be noted that one or more semiconductor dies may be provided. In some embodiments, the semiconductor die 130 described herein may be referred to as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor, die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred to as a chip or a IC of combination-type, and the semiconductor die 130 may be a WiFi chip simultaneously including both of a RF chip and a digital chip. The disclosure is not limited thereto.

Figure 3:
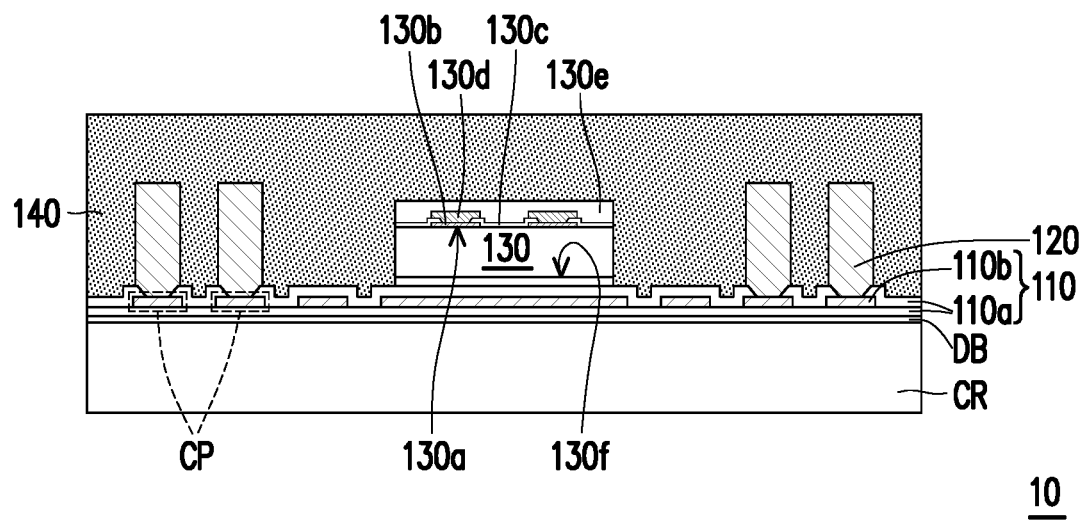

Referring to FIG. 3, in some embodiments, the conductive pillars 120 and the semiconductor die 130 are encapsulated in an insulating encapsulation 140. In some embodiments, the insulating encapsulation 140 is formed on the redistribution circuit structure 110 and over the carrier CR. As shown in FIG. 3, the insulating encapsulation 140 at least fills up the gaps between the conductive pillars 120 and between the conductive pillars 120, the semiconductor die 130 and the connecting film DA1. In some embodiments, the insulating encapsulation 140 covers the conductive pillars 120, the redistribution circuit structure 110 and the connecting film DAL In certain embodiments, as shown in FIG. 3, the conductive pillars 120 and the semiconductor die 130 are not accessibly revealed by the insulating encapsulation 140.

Continued on FIG. 3, in some embodiments, the insulating encapsulation 140 covers the conductive pillars 120, the semiconductor die 130, and the redistribution circuit structure 110 exposed from the conductive pillars 120 and the semiconductor die 130. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity and low loss tangent properties, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 4:
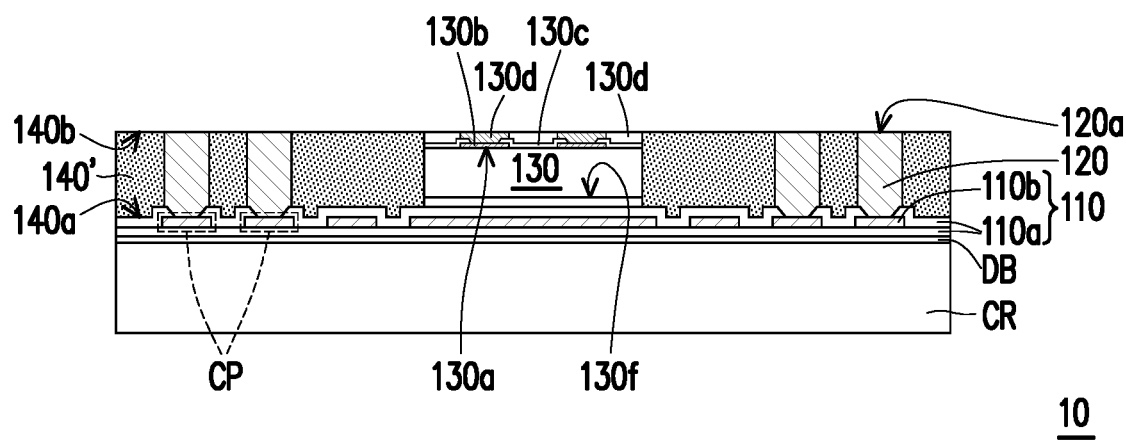

Referring to FIG. 4, in some embodiments, the insulating encapsulation 140 is planarized to form an insulating encapsulation 140' exposing the conductive pillars 120 and the semiconductor die 130. In certain embodiments, as shown in FIG. 4, after the planarization, top surfaces 120a of the conductive pillars 120 and a top surface of the semiconductor die 130 (e.g. top surfaces of the conductive vias 130d and the protection layer 130e) are exposed by a top surface 140a of the insulating encapsulation 140. That is, for example, the top surfaces 120a of the conductive pillars 120 and the top surface of the semiconductor die 130 become substantially leveled with the top surface 140a of the insulating encapsulation 140'. In other words, the top surfaces 120a of the conductive pillars 120, the top surface of the semiconductor die 130, and the top surface 140a of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor die 130 and the conductive pillars 120 may also be planarized. In certain embodiments, the planarizing step may, for example, performed on the over-molded insulating encapsulation 140 to level the top surface 140a of the insulating encapsulation 140', the top surfaces 120a of the conductive pillars 120, and the top surfaces of the conductive vias 130d and the protection layer 130e of the semiconductor die 130.

Figure 5:
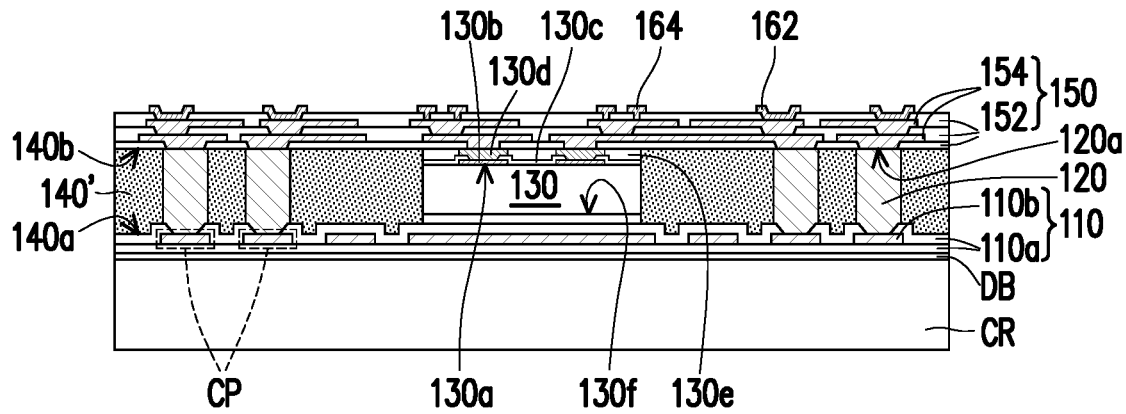

Referring to FIG. 5, in some embodiments, a redistribution circuit structure 150 is formed on the conductive pillars 120, the semiconductor die 130 and the insulating encapsulation 140'. As shown in FIG. 5, the redistribution circuit structure 150 is formed on the top surfaces 120a of the conductive pillars 120, the top surfaces of the conductive vias 130d and the protection layer 130e of the semiconductor die 130 and the top surface 140a of the insulating encapsulation 140'. In some embodiments, the redistribution circuit structure 150 is electrically connected to the conductive pillars 120, and is electrically connected to the semiconductor die 130 through the conductive vias 130d and the pad 130b. In some embodiments, through the redistribution circuit structure 150, the semiconductor die 130 is electrically connected to the conductive pillars 120. In some embodiments, through the redistribution circuit structure 150 and the conductive pillars 120, the semiconductor die 130 is electrically connected to the redistribution circuit structure 110 (e.g. the conductive patterns CP). As shown in FIG. 5, for example, the redistribution circuit structure 150 is referred to as a front-side redistribution layer of the semiconductor die 130 for providing routing function. In some embodiments, as shown in FIG. 5, the semiconductor die 130 is directly located between the redistribution circuit structure 150 and the connecting film DA1, where the conductive pillars 120 and the insulating encapsulation 140' are directly located between the redistribution circuit structure 150 and the redistribution circuit structure 110. In other words, the redistribution circuit structure 110 and the redistribution circuit structure 150 are located at two opposite sides of the insulating encapsulation 140', where the redistribution circuit structure 110 is disposed on a bottom surface 140b of the insulating encapsulation 140' and the redistribution circuit structure 150 is disposed on the top surface 140a of the insulating encapsulation 140'.

In some embodiments, the formation of the redistribution circuit structure 150 includes sequentially forming one or more dielectric layers 152 and one or more metallization layers 154 in alternation. In certain embodiments, as shown in FIG. 5, the metallization layers 154 are sandwiched between the dielectric layers 152, where the top surface of a topmost layer of the metallization layers 154 is exposed by a topmost layer of the dielectric layers 152 and the bottom surface of a bottommost layer of the metallization layers 154 is exposed by a bottommost layer of the dielectric layers 152 to mechanically and electrically connect the conductive pillars 120 and the conductive vias 130*d* of the semiconductor die 130.

In some embodiments, the formation of the dielectric layers 152 may be the same as the formation of the dielectric layers 110*a*, and the formation of the metallization layers 154 may be the same as the formation of the metallization layer 110*b*, thus is not repeated herein. In an alternative embodiment, the material of the dielectric layers 152 may be the same as or different from the material of the dielectric layers 110*a*. In an alternative embodiment, the material of the metallization layers 154 may be the same as or different from the material of the metallization layer 110*b*. The disclosure is not limited thereto. It should be noted that the redistribution circuit structure 150 is not limited to include three dielectric layers and/or two metallization layers. For example, the numbers of the metallization layers and the dielectric layers included in the redistribution circuit structure 150 may be one or more than two. As shown in FIG. 5, in certain embodiments, the conductive pillars CP, the redistribution circuit structure 110 and the redistribution circuit structure 150 together and/or individually provide a routing function for the semiconductor die 130.

Continued on FIG. 5, in some embodiments, a plurality of under-ball metallurgy (UBM) patterns 162 may be disposed on the exposed top surface of the topmost layer of the metallization layers 154 for electrically connecting with conductive elements (e.g. conductive balls), and/or at least one connection pad 164 may be disposed on the exposed top surface of the topmost layer of the metallization layers 154 for electrically connecting with at least one semiconductor elements (e.g. passive components or active components). As shown in FIG. 5, for example, the UBM patterns 162 and the connection pads 164 are formed on and electrically connected to the redistribution circuit structure 150. In some embodiments, the materials of the UBM patterns 162 and the connection pads 164 may include copper, nickel, titanium, tungsten, or alloys thereof or the like, and may be formed by an electroplating process, for example. In one embodiment, the material of the UBM patterns 162 may be the same as that of the connection pads 164. In another embodiment, the material of the UBM patterns 162 may be different from that of the connection pads 164. In one embodiment, there may be only the UBM patterns 162 presented in the package structure PS; however, in an alternative embodiment, there may be only the connection pads 164. The numbers of the UBM patterns 162 and the connection pad 164 are not limited in this disclosure, and may be selected based on the design layout.

Figure 6:
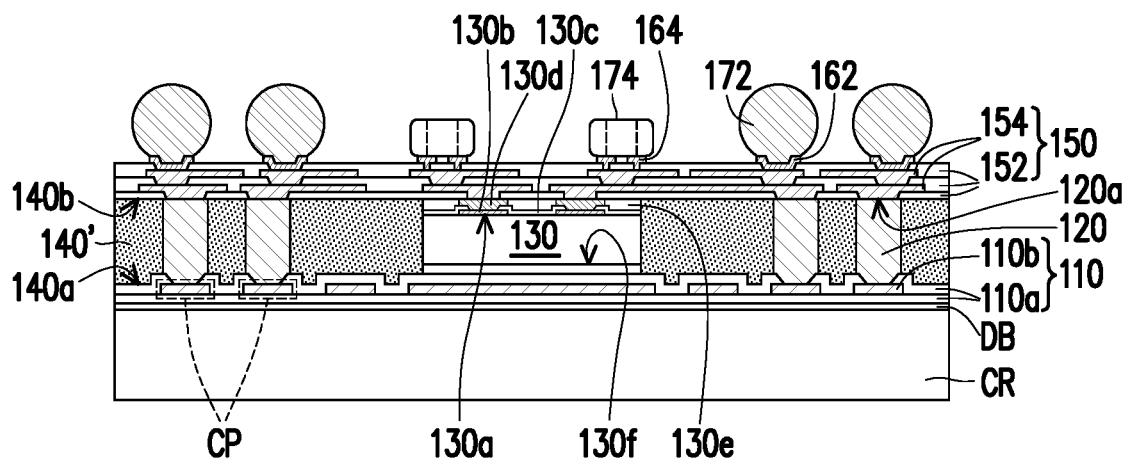

Referring to FIG. 6, in some embodiments, a plurality of conductive elements 172 are formed on the redistribution circuit structure 150. As shown in FIG. 6, the conductive elements 172 are disposed on the UBM patterns 162 over the redistribution circuit structure 150. In some embodiments, the conductive elements 172 may be disposed on the UBM patterns 162 by ball placement process or reflow process. In some embodiments, the conductive elements 172 are, for example, solder balls or ball grid array (BGA) balls. In some embodiments, the conductive elements 172 are connected to the redistribution circuit structure 150 through the UBM patterns 162. As shown in the FIG. 6, some of the conductive elements 172 are electrically connected to the semiconductor die 130 through the UBM patterns 162 and the redistribution circuit structure 150; some of the conductive elements 172 are electrically connected to the conductive pillars 120 through the UBM patterns 162 and the redistribution circuit structure 150; and some of the conductive elements 172 are electrically connected to the redistribution circuit structure 110 (e.g. the conductive patterns CP) through the UBM patterns 162, the redistribution circuit structure 150, and the conductive pillars 120. The number of the conductive elements 172 is not limited to the disclosure, and may be designated and selected based on the number of the UBM patterns 162.

Continued on FIG. 6, in some embodiments, one or more semiconductor devices 174 are provided and disposed on the redistribution circuit structure 150. As shown in FIG. 6, the semiconductor devices 174 are disposed on the connection pads 164, and are connected to the redistribution circuit structure 150 through the connection pads 164. In some embodiments, the semiconductor devices 174 may be disposed on the connection pads 164 through reflow process. In some embodiments, the conductive elements 172 and the semiconductor devices 174 are formed on a surface of the redistribution circuit structure 150, wherein the redistribution circuit structure 150 is located between the insulating encapsulation 140' and the conductive elements 172 and between the insulating encapsulation 140' and the semiconductor devices 174. In some embodiments, as shown in FIG. 6, the semiconductor devices 174 include surface mount devices (e.g. passive devices, such as, capacitors, resistors, inductors, combinations thereof, or the like). The number of the semiconductor devices 174 can be selected based on the number of the connection pad 164. In an alternative embodiment, the semiconductor devices 174 may include surface mount devices of the same type or different types, the disclosure is not limited thereto. In alternative embodiments, the semiconductor devices 174 are optional, and may be omitted.

In some embodiments, the semiconductor devices 174 may be formed prior to the formation of the conductive elements 172. In an alternative embodiment, the conductive elements 172 may be formed after the formation of the semiconductor devices 174. The disclosure is not limited to the disclosure.

Figure 7:
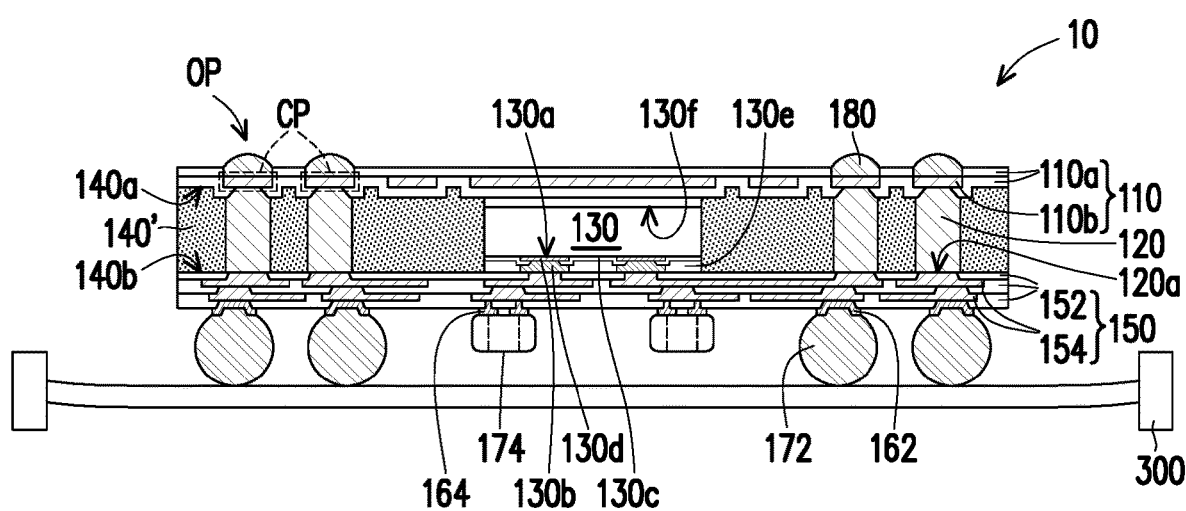

Referring to FIG. 7, in some embodiments, the whole first package 10 along with the carrier CR is flipped (turned upside down), where the conductive elements 172 and the semiconductor devices 174 are placed to a holding device 300, and the carrier CR is then debonded from the redistribution circuit structure 110. In some embodiments, the holding device 300 may be an adhesive tape, a carrier film or a suction pad. The disclosure is not limited thereto.

In some embodiments, the redistribution circuit structure 110 is easily separated from the carrier CR due to the debond layer DB. In some embodiments, the carrier CR is detached from the redistribution circuit structure 110 through a debonding process, and the carrier CR and the debond layer DB are removed. In certain embodiments, the redistribution circuit structure 110 is exposed, as show in FIG. 7. In one embodiment, the debonding process is a laser debonding process. During the debonding step, the holding device 300 is used to secure the first package 10 before debonding the carrier CR and the debond layer DB.

In some embodiments, prior to flipping the first package 10 depicted in FIG. 6 and debonding the carrier CR therefrom, a pre-cutting step is performed to the first package 10. For example, the pre-cutting step cut through at least the redistribution circuit structure 150, the insulating encapsulation 140', and the redistribution circuit structure 110 of the first package 10. The pre-cutting step may, for example, include laser cut, or the like. Due to the pre-cutting step, the first packages 10 interconnected therebetween are partially diced; and due to the debonding step, the partially diced first packages 10 are entirely separated from one another.

Continued on FIG. 7, in some embodiments, the redistribution circuit structure 110 exposed from the debonding step is patterned to expose portions (e.g. the conductive patterns CP) of the metallization layer 110b. In some embodiments, the bottommost layer of the dielectric layers 110a is patterned to form a plurality of openings OP respectively exposing portions of a bottom surface of the metallization layer 110b. The patterning step may, for example, include a laser drilling process; however, the disclosure is not limited thereto. The number of the openings OP is not limited thereto, and may be designated and selected based on the demand.

In some embodiments, after the formation of the openings OP, pre-solders 180 are formed on the bottom surface of the metallization layer 110b (e.g. the conductive patterns CP) exposed by the openings OP formed in the bottommost layer of the dielectric layers 110a. As shown in FIG. 7, the pre-solders 180 are electrically connected to the semiconductor die 130 through the redistribution circuit structure 110 (e.g. the conductive patterns CP), the conductive pillars CP, and the redistribution circuit structure 150, in some embodiments. In some embodiments, through the redistribution circuit structure 110 (e.g. the conductive patterns CP), the conductive pillars CP, the redistribution circuit structure 150, and/or the UBM patterns 162 and the connection pads 164, the conductive elements 172 and/or the semiconductor devices are electrically connected to the per-solders 180. In certain embodiments, the pre-solders 180 are pre-solder pastes, for example. In an alternative embodiment, the pre-solders 180 may be pre-solder blocks. In some embodiments, the material of the pre-solders 180 may include a lead-free solder material (such as Sn—Ag base or Sn—Ag—Cu base materials) with or without additional impurity (such as Ni, Bi, Sb, Au, or the like). The disclosure is not limited thereto. In the disclosure, the pre-solders 180 may be referred to as conductive connectors for connecting to another package. Up to here, the first package 10 is manufactured.

Figure 8:
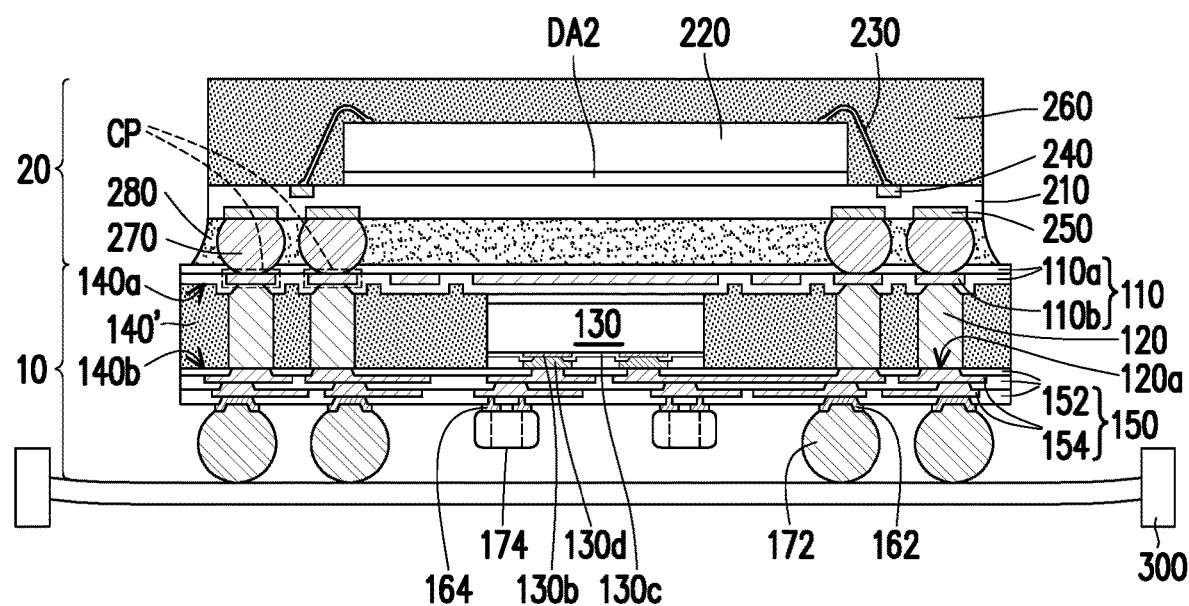

Referring to FIG. 8, in some embodiments, a second package 20 is provided and mounted on the first package 10. In some embodiments, the second package 20 has a substrate 210, at least one semiconductor die 220, bonding wires 230, conductive pads 240, conductive pads 250, an insulating encapsulation 260, conductive balls 270, and an underfill material 280. As shown in FIG. 8, for example, the semiconductor die 220 with a connecting film DA2 disposed thereon is provided and is disposed on the substrate 210 through the connecting film DA2. In some embodiments, the connecting film DA2 is located between the semiconductor die 220 and the substrate 210, and the connecting film DA2 is physically contacts the backside surface of the semiconductor die 220 and a surface of the substrate 210. In some embodiments, due to the connecting film DA2 provided between the semiconductor die 220 and the substrate 210, the semiconductor die 220 and the substrate 210 are stably adhered to each other. In some embodiments, the connecting film DA2 may be, for example, a semiconductor die attach film, a layer made of adhesives or epoxy resin, or the like.

For example, the semiconductor die 220 is mounted on one surface (e.g. top surface, as shown in FIG. 8) of the substrate 210. In some embodiments, the semiconductor die 220 is a logic chip (e.g., central processing unit, microcontroller, etc.), a memory chip (e.g., dynamic random access memory (DRAM) chip, a static random access memory (SRAM) chip, etc.), a power management chip (e.g., power management integrated circuit (PMIC) chip), a radio frequency (RF) chip, a sensor chip, a signal processing chip (e.g., digital signal processing (DSP) chips), a front-end chip (e.g., analog front-end (AFE) chips, the like, or a combination thereof). In one embodiment, the semiconductor die 220 may, for example, be a DRAM chip, but the disclosure is not limited thereto.

In some embodiments, the bonding wires 230 are used to provide electrical connections between the semiconductor die 220 and the conductive pads 240 (such as bonding pads) located on one surface of the substrate 210.

In some embodiments, an insulating encapsulation 260 is formed to encapsulate the semiconductor die 220, the bonding wires 230 and the conductive pads 240 to protect these components. In some embodiments, the materials of the insulating encapsulation 260 is the same as the insulating encapsulation 140/140', and thus is not repeated herein. In one embodiment, the materials of the insulating encapsulation 260 is different from the insulating encapsulation 140/140', the disclosure is not limited thereto.

In some embodiments, through insulator vias (not shown) or interconnects (not shown) may be used to provide electrical connection between the conductive pads 240 and the conductive pads 250 (such as bonding pads) that are located on another surface (e.g. bottom surface) of the substrate 210. In certain embodiments, the conductive pads 250 are electrically connected to the semiconductor die 220 through these through insulator vias or interconnects (not shown).

In some embodiments, the conductive pads 250 of the second package 20 are electrically connected to the conductive patterns CP of the first package 10 through the conductive balls 270 that are sandwiched therebetween, where the conductive balls 270 are formed by joining solder balls (not shown) formed on the conductive pads 250 of the second package 20 and the pre-solder 180 formed on the conductive patterns CP of the first package 10. In certain embodiments, the conductive balls 270 are physically connected to the conductive patterns CP, as shown in FIG. 8. In some embodiments, the first package 10 and the second package 20 are electrically connected through the conductive patterns CP of the first package 10, the conductive pads 250 of the second package 20, and the conductive balls 270 sandwiched between and physically connecting the conductive patterns CP and the conductive pads 250. In the disclosure, the conductive balls 270 may be referred to as conductive joints for connecting to two packages (e.g. the first package 10 and the second package 20 depicted in FIG. 9).

In addition, an underfill material 280 may fill up the gaps between the conductive balls 270 and encapsulate the conductive balls 270. In one embodiment, the underfill material 280 may be formed by underfill dispensing or any other suitable method. In some embodiments, a material of the underfill material 280 may be the same or different from a material of the planarized insulating encapsulation 140' (or saying the insulating encapsulation 140) and/or a material of the insulating encapsulation 260, the disclosure is not limited thereto.

Figure 9:
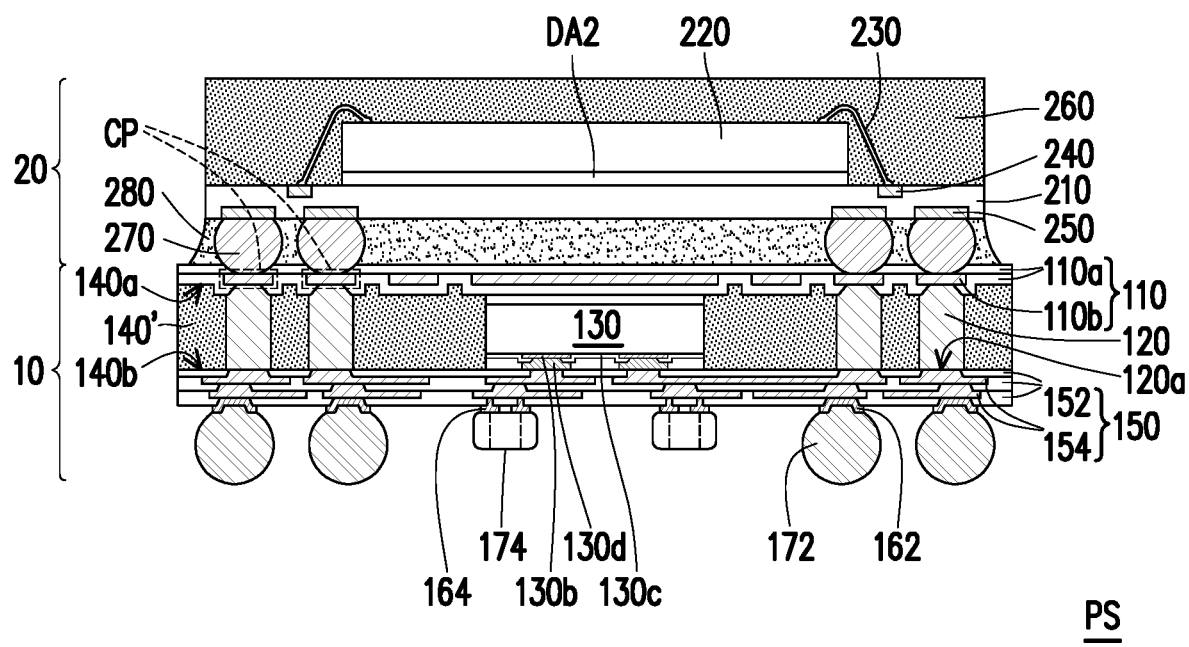
Figure 10:
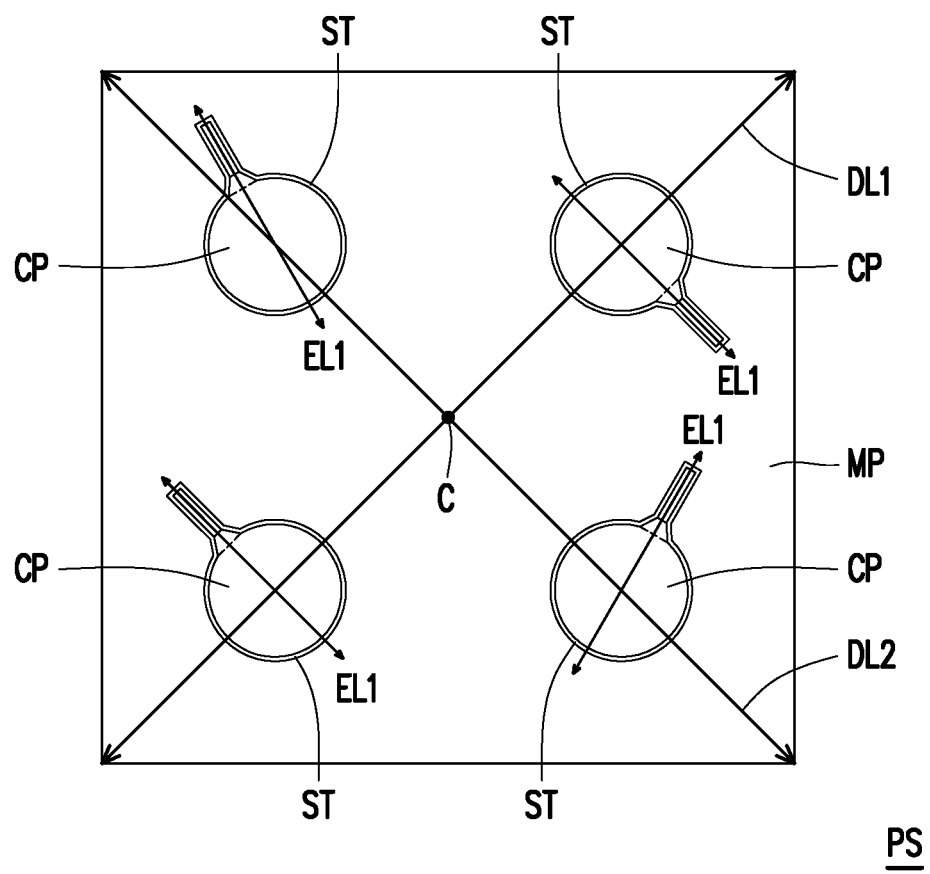
FIG. 10 is a top view illustrating positioning locations of conductive patterns relative to diagonal lines of a package structure in accordance with some embodiments of the disclosure.

Referring to FIG. 9, in some embodiments, the conductive elements 172 and the semiconductor devices 174 are released from the holding device 300 to form the package structure PS. In some embodiments, a dicing process is performed to cut a plurality of the package structures PS interconnected therebetween into individual and separated package structures PS before releasing the conductive elements 172 and the semiconductor devices 174 from the holding device 300. In one embodiment, the dicing process is a wafer dicing process including mechanical blade sawing or laser cutting. Up to here, the manufacture of the package structure PS is completed. The package structure PS depicted in FIG. 9 may be referred to as a package-on package (PoP) structure.

In addition, in the disclosure, for each conductive pattern CP located on (overlapped with) one of the diagonal lines DL1 or DL2 of the package structure PS, an extending direction of each extending line of the conductive pattern CP is different from an extending direction of the respective one diagonal line DL1 or DL2 of the package structure PS. For example, the top view of FIG. 10 illustrates positioning locations of the conductive patterns CP of the metallization layer 110*b* with respect to the diagonal lines DL1, DL2 passing through a center C of the package structure PS, where the conductive patterns CP have the predetermined pattern depicted in FIG. 11A, and the other elements are omitted for simplicity. The extending direction of the extending line EL1 of each conductive pattern CP located on either the diagonal line DL1 or the diagonal line DL2 of the package structure PS is different from the extending direction of the respective one diagonal line DL1 or DL2 of the package structure PS, as shown in FIG. 10, for example. In one embodiment, a minimum included angle between the extending direction of each extending line of one conductive pattern CP located on (overlapped with) one of the diagonal lines DL1 or DL2 of the package structure PS and an extending direction of the respective one diagonal line DL1 or DL2 of the package structure PS is from about 1 degrees to 90 degrees, the disclosure is not limited thereto. For example, the extending directions of the extending lines EL1 of some conductive patterns CP are substantially perpendicular to the extending direction of the respective one diagonal line DL1 or DL2 of the package structure PS, as shown in FIG. 10. Due to such configuration, the stress applied to the conductive patterns CP is suppressed, and the reliability of the package structure PS is further improved.

It is noted that the conductive patterns CP in FIG. 10 having the predetermined pattern depicted in FIG. 11A are used as an example for illustration purpose, the disclosure is not limited thereto. In an alternative embodiment, the conductive patterns CP may have the predetermined pattern(s) depicted in FIG. 11A to FIG. 11D and/or FIG. 12A to FIG. 12D, where the extending directions of the extending lines EL1~EL4 of the conductive pillars CP located on one of the diagonal lines DL1, DL2 of the package structure PS are different from the extending direction of the respective one diagonal line DL1 or DL2.

In some embodiments, the extending directions of the extending lines EL1~EL4 of the conductive pillars CP not located on the diagonal lines DL1, DL2 of the package structure PS may be the same as the extending directions of the diagonal lines DL1, DL2 of the package structure PS, however the disclosure is not limited thereto. In certain embodiments, the extending directions of the extending lines EL1~EL4 of the conductive pillars CP not located on the diagonal lines DL1, DL2 of the package structure PS may be different from the extending directions of at least one of the diagonal lines DL1, DL2 of the package structure PS.

In accordance with some embodiments, a package structure includes an insulating encapsulation, a semiconductor die, and a redistribution circuit structure. The semiconductor die is encapsulated in the insulating encapsulation. The redistribution circuit structure includes conductive patterns, wherein the conductive patterns each comprise a first portion, at least one second portion, and at least one connecting portion. A first edge of the at least one connecting portion is connected to the first portion, and a second edge of the at least one connecting portion is connected to the at least one second portion, wherein the first edge is opposite to the second edge, and a length of the first edge is greater than a length of the second edge.

In accordance with some embodiments, a package structure includes an insulating encapsulation, a semiconductor die, and a redistribution circuit structure. A semiconductor die is encapsulated in the insulating encapsulation. The redistribution circuit structure includes at least one metallization layer having a main portion and conductive patterns separated from the main portion through slits, wherein the conductive patterns each comprise a first portion, at least one second portion, and at least one connecting portion. The at least one connecting portion connects the first portion and the at least one second portion, wherein for at least one conductive pattern located on one diagonal line of the package structure, a first extending direction of a line passing through a center of the first portion and a center of the at least one connecting portion is different from a second extending direction of the diagonal line of the package structure.

In accordance with some embodiments, a package structure includes an insulating encapsulation, a semiconductor die, conductive pillars, a first redistribution circuit structure, and conductive elements. The semiconductor die and the conductive pillars are encapsulated in the insulating encapsulation. The first redistribution circuit structure is located on the insulating encapsulation, wherein the first redistribution layer comprises a conductive plate, conductive patterns, and slits sandwiched therebetween. The conductive patterns each comprise a contact pad, contact lines, and protrusions, wherein each protrusion extends from an edge of the contact pad toward an edge of a respective one contact line, and a width of each protrusion is gradually decreased from the contact pad toward the respective one contact line. The conductive joints are connected to the contact pads, wherein the first redistribution circuit structure is located between the conductive joints and the conductive pillars.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:
1. A package structure, comprising:
a semiconductor die, having an active surface and a rear surface opposite to the active surface;
a first redistribution circuit structure, disposed on the rear surface of the semiconductor die, and comprising conductive patterns and a main portion separated from the conductive patterns by slits, wherein the conductive patterns each comprise:
a first portion;
at least one second portion; and
at least one connecting portion, wherein a first edge of the at least one connecting portion is connected to the first portion, a second edge of the at least one connecting portion is connected to the at least one second portion, the first edge is opposite to the second edge, and a length of the first edge is greater than a length of the second edge, wherein a plurality of arc-shape openings are located within the first portion, and the plurality of arc-shape openings are spaced away from one another and arranged in a concentric manner, wherein a width of each of the slits is constant and ranges from 40 µm to 50 µm, and the slits are separated from one another through the main portion and are conformally and completely in contact with contours of the conductive patterns, respectively; and a second redistribution circuit structure, disposed on the active surface of the semiconductor die.

2. The package structure of claim 1, wherein for each of the conductive patterns, the at least one connecting portion further has a third edge and a fourth edge, the third edge and the fourth edge are non-parallel, and ends of each of the third edge and the fourth edge are respectively connected to one end of the first edge and one end of the second edge, wherein a distance between the first edge and the second edge is approximately from 50 µm to 70 µm.

3. The package structure of claim 2, wherein an included angle between extending lines of the third edge and the fourth edge is approximately from 50 degrees to 70 degrees.

4. The package structure of claim 1, wherein a width of each of the plurality of arc-shape openings is approximately from 40 µm to 50 µm.

5. The package structure of claim 4, wherein the plurality of arc-shape openings are spaced away from one another with an equal distance ranging from about 20 µm to about 40 µm.

6. The package structure of claim 1, wherein for each of the conductive patterns located on a diagonal line of the package structure, a first extending direction of a line passing through a center of the first portion and a center of the at least one connecting portion is different from a second extending direction of the diagonal line of the package structure, wherein the diagonal line of the package structure is a corner-to-corner line that joins two opposite corners of a rectangular profile of the package structure and passes and intersects with a center of the rectangular profile of the package structure in a top view thereof.

7. The package structure of claim 6, wherein the first extending direction is substantially perpendicular to the second extending direction.

8. The package structure of claim 1, further comprising:
a sub-package, comprising:
at least one die, encapsulated in an encapsulant; and
a plurality of conductive joints, disposed over and electrically coupled to the semiconductor die,
wherein the sub-package is disposed on the first redistribution circuit structure by connecting the plurality of conductive joints to the conductive patterns.

9. The package structure of claim 8, further comprising:
an underfill, disposed between the first redistribution circuit structure and the sub-package and laterally covering the plurality of conductive joints.

10. A package structure, comprising:
an insulating encapsulation;
a semiconductor die, encapsulated in the insulating encapsulation; and
a back-side redistribution circuit structure, comprising at least one metallization layer having a main portion and conductive patterns separated from the main portion through slits, wherein the conductive patterns each comprise:
a first portion;
at least one second portion; and
at least one connecting portion, connecting the first portion and the at least one second portion, wherein in a top view, each of the conductive patterns disposed on at least one diagonal line of the package structure has a line passing through a center of the first portion, a center of the at least one second portion and a center of the at least one connecting portion, the line is substantially perpendicular to the at least one diagonal line, wherein in the top view, the package structure has a rectangular profile, and the at least one diagonal line is a vertex-to-vertex line joining two vertices of the rectangular profile and passing through a center of the rectangular profile, wherein a width of each of the slits is constant, and each of the conductive patterns is enclosed in a respective one slit of the slits, wherein a plurality of arc-shape openings are located within the first portion, and the plurality of arc-shape openings are arranged into an annular shape by a concentric manner and are spaced away from one another, wherein the back-side redistribution circuit structure is closer to a rear side of the semiconductor die than an active side of the semiconductor die, the rear side of the semiconductor die is opposite to the active side of the semiconductor die.

11. The package structure of claim 10, wherein the slits are conformally located along contours of the conductive patterns, respectively.

12. The package structure of claim 10, wherein the width of each of the slits is approximately from 40 µm to 50 µm.

13. The package structure of claim 10, wherein for each of the conductive patterns, the at least one connecting portion is located outside the first portion, the at least one connecting portion has two non-parallel edges, ends of the two non-parallel edges distancing with a first gap are connected to the first portion, other ends of the two non-parallel edges distancing with a second gap are connected to the at least one second portion, and the first gap is greater than the second gap.

14. The package structure of claim 13, wherein an included angle between extending lines of the two non-parallel edges is approximately from 50 degrees to 70 degrees.

15. The package structure of claim 10, wherein the plurality of arc-shape openings are offset from one another in a direction of the center of the first portion toward to a perimeter of the first portion.

16. A package structure, comprising:
an insulating encapsulation;
a semiconductor die and conductive pillars, encapsulated in the insulating encapsulation, wherein the semiconductor die has an active surface and a rear surface opposite to the active surface;
a first redistribution circuit structure, located on the insulating encapsulation and disposed on the rear surface of the semiconductor die, wherein the first redistribution circuit structure comprises conductive patterns and a main portion separated from the conductive patterns by slits, wherein a width of each of the slits is constant and ranges from 40 µm to 50 µm, and the slits are separated from one another through the main portion and are conformally and completely in contact with contours of the conductive patterns, respectively, and the conductive patterns each comprise:
a first portion;
second portions; and
connecting portions, wherein each connecting portion extends from an edge of the first portion toward an edge of a respective one second portion, and a width of each connecting portion is gradually decreased from the first portion toward the respective one second portion, wherein a plurality of arc-shape openings are located within the first portion, and the plurality of arc-shape openings are spaced away from one another and arranged in a concentric manner;
a conductive joint, connected to the first portion, wherein the first redistribution circuit structure is located between the conductive joint and the conductive pillars; and
a second redistribution circuit structure, disposed on the active surface of the semiconductor die.

17. The package structure of claim 16, further comprising:
conductive elements, connected to the second redistribution circuit structure, wherein the second redistribution circuit structure is located between the insulating encapsulation and the conductive elements.

18. The package structure of claim 17, further comprising:
a sub-package, mounted on and electrically connected to the semiconductor die through the conductive joint.

19. The package structure of claim 16, wherein for each conductive pattern located on one diagonal line of the package structure, a first extending direction of a line passing through a center of the first portion and a center of one of the connecting portions is different from a second extending direction of the one diagonal line of the package structure,
wherein the one diagonal line of the package structure is a corner-to-corner line that joins two opposite corners of a rectangular profile of the package structure and passes and intersects with a center of the rectangular profile of the package structure in a top view thereof.

20. The package structure of claim 19, wherein the first extending direction is substantially perpendicular to the second extending direction.

* * * * *